United States Patent
Richter et al.

(10) Patent No.: US 7,938,973 B2
(45) Date of Patent: May 10, 2011

(54) ARC LAYER HAVING A REDUCED FLAKING TENDENCY AND A METHOD OF MANUFACTURING THE SAME

(75) Inventors: Ralf Richter, Dresden (DE); Joerg Hohage, Dresden (DE); Martin Mazur, Pulsnitz (DE)

(73) Assignee: Advanced Micro Devices, Inc., Austin, TX (US)

( * ) Notice: Subject to any disclaimer, the term of this patent is extended or adjusted under 35 U.S.C. 154(b) by 1062 days.

(21) Appl. No.: 11/733,350

(22) Filed: Apr. 10, 2007

(65) Prior Publication Data
US 2008/0078738 A1 Apr. 3, 2008

(30) Foreign Application Priority Data
Sep. 29, 2006 (DE) .................. 10 2006 046 364

(51) Int. Cl.
*H01B 13/00* (2006.01)
(52) U.S. Cl. .......... 216/24; 216/47; 216/51; 216/57; 216/74; 257/E21.257; 257/E21.577
(58) Field of Classification Search .......... None
See application file for complete search history.

(56) References Cited

U.S. PATENT DOCUMENTS

| | | | |
|---|---|---|---|
| 6,174,818 B1 | 1/2001 | Tao et al. | 438/733 |
| 6,294,457 B1 | 9/2001 | Liu | 438/623 |
| 7,279,389 B2* | 10/2007 | Romero et al. | 438/300 |
| 7,309,654 B2* | 12/2007 | Schaller et al. | 438/700 |
| 7,314,824 B2* | 1/2008 | Frohberg et al. | 438/636 |
| 7,326,646 B2* | 2/2008 | Ruelke et al. | 438/636 |
| 7,416,992 B2* | 8/2008 | Lehr et al. | 438/723 |
| 2005/0208755 A1* | 9/2005 | Ruelke et al. | 438/622 |
| 2006/0024955 A1* | 2/2006 | Frohberg et al. | 438/636 |
| 2006/0223250 A1* | 10/2006 | Romero et al. | 438/197 |
| 2006/0246711 A1* | 11/2006 | Lehr et al. | 438/622 |
| 2007/0004214 A1* | 1/2007 | Schaller et al. | 438/700 |
| 2008/0001295 A1* | 1/2008 | Alba et al. | 257/760 |
| 2008/0045011 A1* | 2/2008 | Fuller et al. | 438/669 |
| 2008/0076244 A1* | 3/2008 | Ye et al. | 438/597 |
| 2008/0078738 A1* | 4/2008 | Richter et al. | 216/13 |

FOREIGN PATENT DOCUMENTS

| | | |
|---|---|---|
| DE | 10260619 A1 | 7/2004 |
| DE | 1004037089 A1 | 3/2006 |
| DE | 1004042169 A1 | 7/2006 |
| EP | 0 951 065 A2 | 10/1999 |

OTHER PUBLICATIONS

Translation of Official Communication from German Patent Office for German Patent Application No. 10 2006 046 364.1-33 dated Apr. 14, 2010.

* cited by examiner

*Primary Examiner* — Allan Olsen
(74) *Attorney, Agent, or Firm* — Williams, Morgan & Amerson, P.C.

(57) ABSTRACT

By incorporating a material exhibiting a high adhesion on chamber walls of a process chamber during sputter etching, the defect rate in a patterning sequence on the basis of an ARC layer may be significantly reduced, since the adhesion material may be reliably exposed during a sputter preclean process. The corresponding adhesion layer may be positioned within the ARC layer stack so as to be reliably consumed, at least partially, while nevertheless providing the required optical characteristics. Hence, a low defect rate in combination with a high process efficiency may be achieved.

20 Claims, 5 Drawing Sheets

ARC LAYER HAVING A REDUCED FLAKING TENDENCY AND A METHOD OF MANUFACTURING THE SAME

BACKGROUND OF THE INVENTION

1. Field of the Invention

Generally, the present disclosure relates to the formation of integrated circuits, and, more particularly, to patterning dielectric materials in semiconductor devices by means of sophisticated lithography techniques using appropriate anti-reflective coating (ARC) layers.

2. Description of the Related Art

In modern integrated circuits, minimum feature sizes, such as the channel length of field effect transistors, have reached the deep sub-micron range, thereby steadily increasing the performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

During the manufacturing process for forming respective wiring layers of semiconductor devices, frequently respective dielectric materials may have to be patterned to receive appropriate openings, which are filled with a conductive material to establish an electrical connection with circuit elements located in the device layer of the semiconductor device. Hence, the patterning of these openings requires highly sophisticated lithography processes, since the minimal dimensions of respective openings may be comparable with the resolution capability of modern lithography systems. In a sophisticated photolithography process, a resist material of well-defined photochemical characteristics with respect to the exposure wavelength under consideration is selectively exposed on the basis of a reticle to generate a latent image in the resist material, which, after developing the latent image, may be used as a mask for patterning a material layer formed below the resist mask. The continuous drive for smaller feature sizes requires reduced exposure wavelengths to be used for the imaging process, since the resolution of the optical system depends on, among other things, the wavelength of the exposure light. Hence, the corresponding resist materials also have to be adapted to the shorter exposure wavelength, while additionally the corresponding layer thickness of the resist material has to be reduced to comply with the respective absorption lengths obtained for the specified wavelengths within the resist material. For a precise generation of a latent image in the resist material, i.e., the precise deposition of energy above a well-defined threshold, interfering reflections of the exposure light at interfaces of different layers formed below the resist material have to be reduced as much as possible. For this reason, respective anti-reflective coating (ARC) layers may have to be provided, whose optical characteristics are tailored with respect to the incoming exposure wavelength so as to minimize the back reflection of light after passing through the resist material. Hence, for a given exposure wavelength and a specified process sequence, dedicated ARC materials are provided with a specific thickness and material composition to obtain a desired index of refraction and extinction coefficient. For example, nitrogen-enriched silicon dioxide is a frequently used ARC material, since the optical characteristics thereof may be readily adjusted by varying the amount of oxygen and nitrogen during the deposition of the layer.

A further problem in patterning material layers on the basis of sophisticated resist materials for short exposure wavelength has been underestimated in the past and is now considered a major challenge in the patterning of dielectrics, such as the formation of contact plugs and vias of metallization structures. After the exposure the resist materials and during developing the photoresist, certain portions of the resist, which have been properly exposed, may, however, not be completely removed as required and thus the structure may then not be correctly transferred into the underlying dielectric material during the subsequent etch process. The effect of insufficiently exposing and developing the photoresist is also referred to as resist poisoning. It is believed that a significant change of the resist sensitivity may be caused by an interaction of nitrogen and nitrogen radicals with the resist layer, thereby locally blocking the photo acidic generator effect during exposure and post-exposure bake of the resist and thus locally modifying the resist structure after resist development.

The problem is becoming even more important as the wavelength of the lithography used is reduced as a consequence of more sophisticated process requirements. For instance, currently the patterning of critical features sizes of cutting edge devices may be performed on the basis of a 193 nm light source, requiring appropriately designed photoresists that are highly sensitive in this wavelength range. It turns out, however, that, with increased sensitivity at shorter wavelengths, the available photoresists also exhibit an increased sensitivity for resist poisoning mechanisms. Since the introduction of the 90 nm technology and beyond may also require a correspondingly advanced lithography process in the formation of metallization structures contacting the circuit elements, increased problems may occur during the patterning of the dielectric as nitrogen and/or compounds may be present in well-approved ARC materials comprised of silicon oxynitride (SiON) and other layers in the layer stack. It is therefore usually necessary to provide a cap layer for the ARC material providing sufficient protection against undue nitrogen contamination of the resist material, while on the other hand not unduly affecting the optical behavior of the actual ARC material. For example, silicon dioxide may be efficiently used as a cap material, wherein a thickness thereof may be specifically designed with respect to the ARC material and also with respect to other criteria in view of process compatibility with preceding and subsequent processes, such as resist strip, etching and the like.

Moreover, due to the complexity of the entire patterning process sequence, including the process for forming the ARC layer including the cap layer, the resist coating and processing, the lithography process and the etching including the resist strip and the like, a high process efficiency, not only in view of yield but also in view of throughput, is highly desirable to reduce the overall production costs. In this respect, the ARC stack comprising the silicon oxynitride (SiON) and the SiO material is highly advantageous, since it may be formed in a single deposition chamber on the basis of well-established process parameters.

It appears, however, that the overall process yield may be reduced due to a moderately high defect rate, which may even increase during the course of processing a plurality of substrates. With reference to FIGS. 1a-1d, a typical conventional process flow will now be described in more detail to illustrate the problems associated therewith.

Figure 1A:
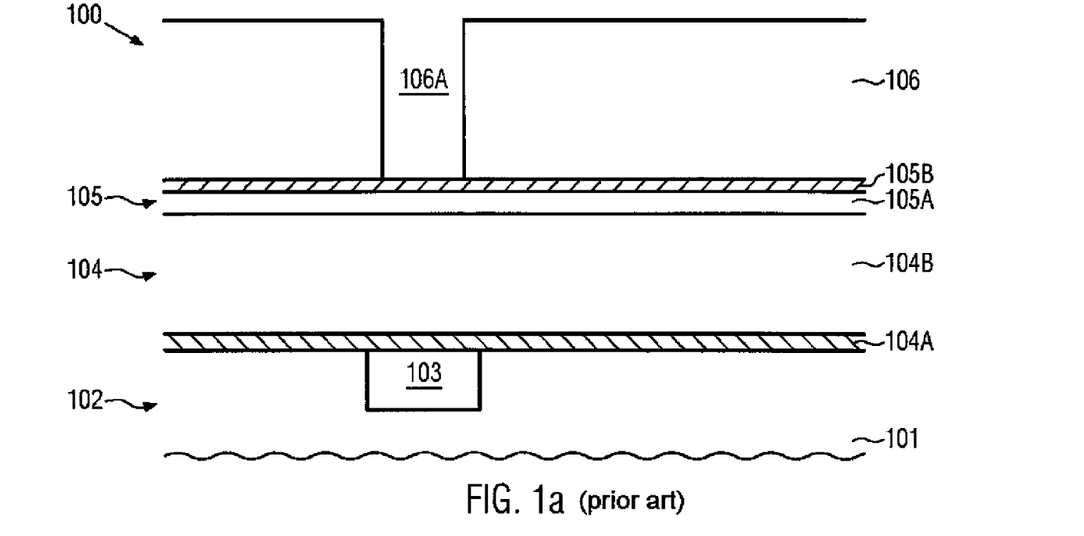
FIGS. 1a-1c schematically illustrate cross-sectional views of a semiconductor device during the patterning sequence for forming a contact opening on the basis of an efficient ARC according to a conventional process sequence.

FIG. 1a schematically illustrates a cross-sectional view of a semiconductor device 100, which may comprise a substrate 101, such as a silicon substrate, a silicon-on-insulator (SOI) substrate and the like. Furthermore, the substrate 101 may have formed thereon respective circuit elements, which may commonly be referred to as 102, that may represent semiconductor devices, such as transistors, capacitors and the like or other conductive regions. As an example, a single contact area 103 of a transistor element, such as a drain or source region or a contact area of a gate electrode, is shown in FIG. 1a.

The semiconductor device 100 may further comprise an interlayer dielectric material 104, which may dielectrically isolate circuit elements from each other, wherein the interlayer dielectric material 104 may be comprised of a first layer 104A, acting as an etch stop layer, and a second layer 104B, which may represent the actual dielectric material providing the desired electrical and mechanical characteristics. For example, in sophisticated applications, the etch stop layer 104A may be comprised of silicon nitride, for instance exhibiting a high intrinsic stress, while the layer 104B may be comprised of silicon dioxide formed on the basis of high density plasma chemical vapor deposition, sub-atmospheric chemical vapor deposition on the basis of TEOS and the like. Since the interlayer dielectric material 104 has to be patterned so as to receive a corresponding contact opening for connecting to the contact area 103, which may represent a circuit feature of highly scaled lateral dimensions, a sophisticated patterning process sequence also has to be employed for patterning the material 104 as previously explained.

Hence, an efficient anti-reflecting coating (ARC) 105 is formed on the interlayer dielectric material 104, wherein the ARC 105 is comprised of a first layer 105A, which provides the required optical characteristics, i.e., a high degree of absorption in order to avoid unwanted back reflection into an overlying resist mask 106. As previously explained, silicon oxynitride (SiON) may be advantageously used, wherein the respective optical characteristics may be defined by the ratio of the corresponding oxygen and nitrogen species. Furthermore, the ARC 105 may comprise a cap layer 105B comprised of silicon dioxide in order to avoid undue nitrogen contamination of the resist mask 106. Typically, the thickness of the cap layer 105B is significantly less compared to the thickness of the actual ARC material of the layer 105A, wherein, for instance, in sophisticated applications necessitating an exposure wavelength of 248 nm or even 193 nm, a thickness of the layer 105A is in the range of several tenths of nanometers, while a thickness of the cap layer 105B is 10 nm and even less. Moreover, in this manufacturing stage, a respective opening 106A is formed in the resist mask 106 so as to substantially represent the corresponding lateral dimensions of a corresponding contact opening to be formed in the interlayer dielectric material 104.

A typical process flow for forming the semiconductor device 100 as shown in FIG. 1a may comprise the following processes. After manufacturing the respective circuit elements 102, including the contact area 103, on the basis of well-established techniques, the interlayer dielectric material 104 may be deposited by first providing the contact etch stop layer 104A on the basis of well established plasma enhanced chemical vapor deposition (PECVD) techniques, followed by the deposition of the silicon dioxide material as previously described. Thereafter, the surface topography of the material 104 may be planarized, if required, in order to provide enhanced surface conditions for the subsequent patterning of the material 104. Thereafter, the ARC 105 may be formed in a combined process, wherein, in a first deposition step, the respective process parameters may be controlled such that a desired material composition of the silicon oxynitride is maintained, wherein substantially pure silicon dioxide may be subsequently deposited in order to form the cap layer 105B having the required low thickness so as to not unduly influence the optical characteristics and the etch properties during subsequent manufacturing processes. Next, the resist mask 106 may be formed on the basis of well-established techniques, including spin coating of a resist material adapted to the respective exposure wavelength, such as 248 nm or 193 nm for sophisticated applications, followed by respective treatments, such as baking and the like. Thereafter, the resist material may be exposed and may be developed in order to form the opening 106A, wherein the ARC 105 may provide the desired optical characteristics while additionally substantially suppressing any adverse effect of nitrogen on the resist material of the mask 106.

Figure 1B:
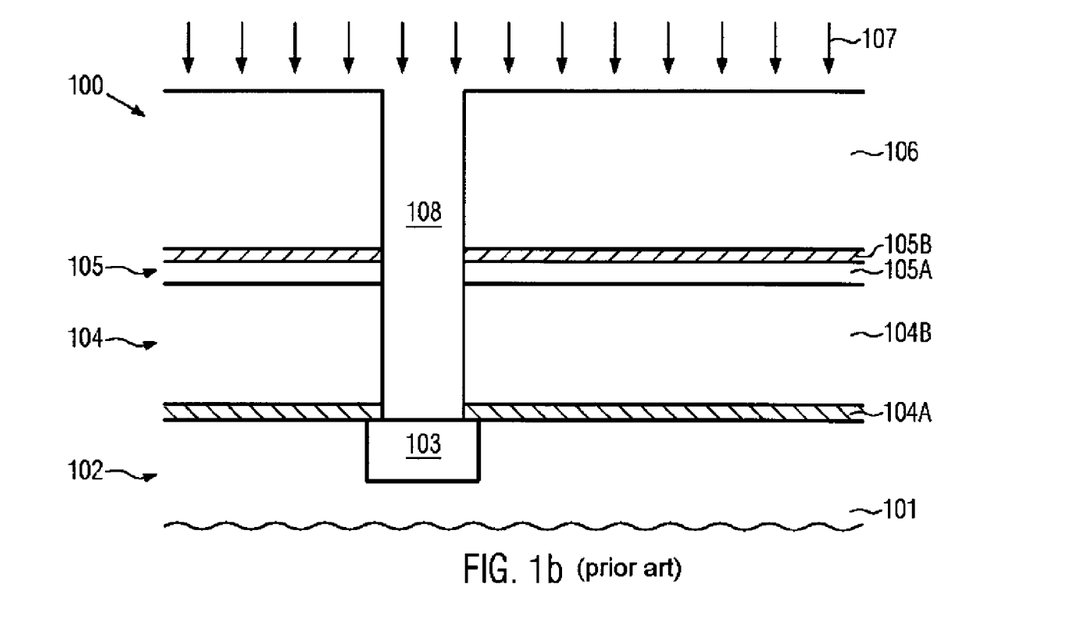

FIG. 1b schematically illustrates the semiconductor device 100 in a further advanced manufacturing stage, in which a corresponding contact opening 108 is formed through the ARC 105 and the interlayer dielectric material 104. For this purpose, a corresponding etch sequence 107 may be performed so as to etch through the ARC 105 and through the layer 104B, wherein the corresponding etch step may be reliably controlled on the basis of the contact etch stop layer 104A, which may then be opened in a separate etch step of the process 107.

Thereafter, the etch sequence 107 may comprise a further step in order to remove the resist mask 106 and concurrently remove a portion of the ARC material 105, wherein at least the cap layer 105A may be removed. A corresponding process sequence may be highly advantageous with respect to the overall throughput, since the number of process steps and required process chambers in the etch sequence 107 may be reduced compared to other approaches, in which the resist mask 106 may be removed in a separate step followed by an additional etch process for removing the cap layer 105B and a portion of the layer 105A. After the combined removal of the resist mask 106 and the cap layer 105B in combination with a portion of the layer 105A, the resulting surface of the device 100 may be prepared for the deposition of an appropriate barrier material, required for filling the respective contact opening 108 with an appropriate material, such as tungsten, tungsten silicide and the like.

Figure 1C:
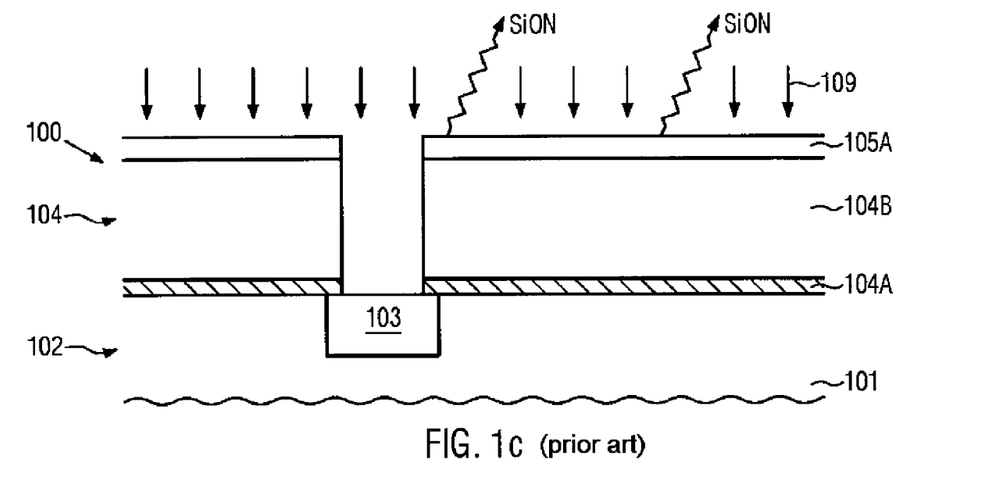

FIG. 1c schematically illustrates the semiconductor device 100 during a corresponding sputter etch process 109, which may represent an initial phase of a corresponding sputter deposition process, wherein respective surface portions of the contact opening 108 and the exposed contact area 103 are cleaned in order to provide the desired barrier and adhesion characteristics of the material to be deposited. It appears, however, that a corresponding defect rate caused by particle contamination of substrates having formed thereon a semiconductor device 100 according to the manufacturing stage as shown in FIG. 1c may significantly increase after the sputter etch process 109, wherein, additionally, a corresponding increase of the defect rate is observed with an increasing number of substrates processed within a respective sputter etch tool.

Figure 1D:
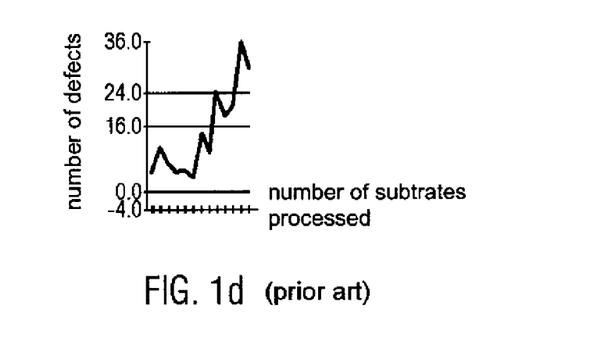
FIG. 1d schematically illustrates a graph illustrating the time progression of a defect rate obtained after a sputter etch process of the conventional process sequence.

FIG. 1d schematically illustrates a corresponding progression over time of a defect rate for a plurality of substrates processed according to the process sequence described with reference to FIGS. 1a-1c, wherein the measurement relates to the point of the process flow after the sputter etch process 109. The vertical axis represents the number of defects per wafer measured, while the horizontal axis represents the number of wafers processed. It is evident that an initially high defect rate after the sputter etch process 109 may be obtained and this defect rate may even significantly increase with the number of substrates processed in the respective sputter etch tool. It is believed that the increasing defect rate may be related to a corresponding contamination of chamber walls of the respective process tool due to ion bombardment of the exposed substrate surface during the sputter etch process 109, which may cause the sputtering off of silicon nitride components, silicon and oxygen, wherein a corresponding material composition may deposit on the chamber walls having a reduced degree of adhesion so that a corresponding probability for flaking off of the wall surfaces may increase with increasing process time of the respective sputter tool. Thus, although a highly efficient process sequence may be established on the process flow described above with respect to throughput, a significant reduction in yield may be observed due to the increasing defect rate after the sputter etch process 109.

It is well known that silicon dioxide, when subjected to a sputter etch process, may also be deposited on chamber walls of respective process chambers, yet with a significantly reduced probability for flaking off, thereby not unduly contributing to an increased defect rate. However, maintaining the silicon dioxide layer 105B during the etch sequence 107 may result in increased process complexity of the corresponding etch sequence. Also, providing an increased thickness of the layer 105B so as to maintain a portion thereof even after the process sequence 107 may significantly deteriorate a corresponding process result in patterning the contact opening 108, thereby rendering this option less desirable.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for enhancing the performance of a process sequence for patterning dielectric materials on the basis of sophisticated lithography processes using an anti-reflective coating (ARC), wherein an efficient patterning process may be maintained while a corresponding defect rate during a subsequent sputter etch process for preparing the exposed surface portions receiving an appropriate conductive material may be significantly reduced in that a moderately high amount of material may be provided within the respective ARC layer that has a significantly reduced tendency for flaking off from chamber walls of a process tool. For this purpose, the corresponding moderately high amount of "adhesion" material may be appropriately distributed in an upper portion of the ARC so as to not unduly affect the optical behavior of the ARC, while nevertheless providing a high amount of the adhesion material to be exposed and thus liberated during the sputter etch process. Consequently, the ARC may itself include a source of adhesion material for reducing the flaking probability during a sputter etch process by at least partially compensating for materials of reduced adhesion characteristics that may also be sputtered off, thereby providing a high throughput compared to other strategies, in which, for instance, additional dummy substrates may have to be processed in order to provide a certain amount of adhesion material, such as silicon dioxide, on the respective chamber walls.

According to one illustrative embodiment disclosed herein, a method comprises forming an anti-reflective layer stack with preselected optical characteristics on a material layer located above a substrate, wherein the anti-reflective layer stack comprises a substantially nitrogen-free cap layer and at least one intermediate adhesion layer. The adhesion layer has a higher adhesion on a surface when sputtered off during a sputter cleaning process compared to other materials contained in the anti-reflective layer stack. The method further comprises patterning the anti-reflective layer stack and the material layer on the basis of a resist mask formed on the anti-reflective layer stack to form an opening in the material layer. Furthermore, the resist mask and at least the cap layer are removed in a common etch sequence. The method further comprises performing a sputter cleaning process prior to depositing a barrier material layer in the opening, wherein the sputter cleaning process consumes a portion of the intermediate adhesion layer.

According to another illustrative embodiment disclosed herein, a method comprises determining a removal rate for material of an anti-reflective layer stack during an etch process sequence including a resist strip process and a sputter etch process, wherein the anti-reflective layer stack comprises one or more material layers having a first material composition, a cap layer of a first specified thickness and an adhesion material layer having a second material composition other than the first material composition. The material of the adhesion material layer has a higher adhesion to surfaces when sputtered off during the sputter etch process compared to the first material composition. Furthermore, the method comprises determining a target height position of the adhesion layer within the anti-reflective layer stack, wherein the target height position specifies a position where at least a portion of the adhesion layer is consumed after the etch sequence. Finally, the anti-reflective layer stack is formed with the adhesion layer positioned at the target height above a plurality of substrates having formed thereon a dielectric layer to be patterned on the basis of the anti-reflective layer stack.

According to yet another illustrative embodiment disclosed herein, a method comprises forming an anti-reflective layer stack on a material layer of a microstructure device, wherein the anti-reflective layer stack comprises at least a first material and a second material other than the first material. Moreover, a first portion of the anti-reflective layer stack is removed during a resist strip process and a second portion of the anti-reflective layer stack is removed by a sputter process, wherein the second portion comprises the first and second materials.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for appropriately positioning a material within an ARC layer so as to not unduly affect the optical and etch performance of the ARC layer, while concurrently significantly reducing the probability for the flaking off of foreign surfaces of the ARC material, when being sputtered off from semiconductor substrates during a sputter etch processing. Thus, a corresponding ARC may be designed such that, on the one hand, the required etch and patterning performance may be maintained with respect to a specified lithography and etch sequence, while, additionally, an internal source of "adhesion" material is incorporated in the ARC layer in order to expose sufficient adhesion material during a sputter etch process to maintain the flaking probability at a low level, even if a plurality of substrates are sequentially processed in a respective sputter etch tool. In this way, an efficient process sequence may be maintained, wherein, for instance, a desired amount of the ARC material or any other cap layer material may be efficiently removed during a corresponding resist strip process, while nevertheless adhesion material may be exposed during the subsequent sputter etch process, at least in an amount so as to compensate for any further materials that may be sputtered off during the sputter process, which may have per se a high tendency for flaking off from respective surfaces. Thus, the respective process chamber may be "conditioned" by each individual substrate processed therein, thereby eliminating the necessity of processing respective "conditioning" substrates in addition to actual product substrates, which would contribute to an undue reduction of throughput.

Figure 2A:
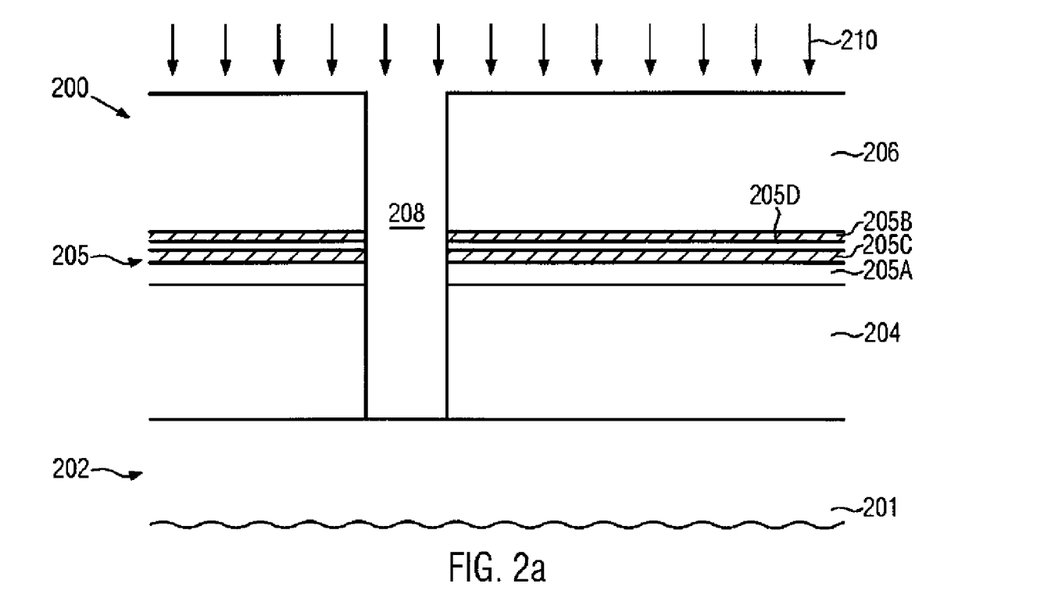
FIGS. 2a-2c schematically illustrate cross-sectional views of a semiconductor device during the patterning of a material layer on the basis of an ARC including a certain amount of adhesion material during a sputter etch process according to illustrative embodiments disclosed herein.

FIG. 2a schematically illustrates a cross sectional view of a semiconductor device 200 comprising a substrate 201, which may represent any appropriate carrier material for forming thereon respective microstructure devices, such as circuit elements in the form of transistors, capacitors, resistors and the like, or any other micromechanical, microelectronic, optoelectronic components and the like. The substrate 201 may represent a semiconductor substrate, such as a silicon substrate, a silicon/germanium substrate and the like, wherein depending on device requirements, an SOI configuration may be provided in which a buried insulating layer (not shown) may be formed between the actual carrier material and a corresponding semiconductor layer, in and on which respective circuit elements may be formed. For convenience, a layer 202 may representatively indicate such configurations, which may include circuit elements, or any other microstructure devices formed on the basis of any appropriate device configuration. In one illustrative embodiment, the layer 202, which may be referred to as a device layer, may comprise circuit elements having respective contact areas, to which a corresponding electrical connection is to be provided, while, in other illustrative embodiments, the device layer 202 may represent a certain level of a metallization structure, which may require an electrical connection to a further metallization level to be formed above the layer 202. It should be appreciated that, in some illustrative embodiments, respective features, such as field effect transistors and the like, may be provided in the device layer 202 that may have critical dimensions of 100 nm and even significantly less, for instance 50 nm and less, when, for example, a gate length of a field effect transistor is considered as a critical dimension. The semiconductor device 200 may further comprise a material layer 204 formed above the device layer 202, wherein the material layer 204 may be comprised of any appropriate material as demanded by device requirements. In one illustrative embodiment, the material layer 204 may represent an interlayer dielectric material formed between respective metallization layers of sophisticated semiconductor devices, or the material layer 204 may represent an interlayer dielectric material formed so as to dielectrically enclose respective circuit elements, such as transistors, capacitors and the like, formed in and on the device layer 202. For example, the material layer 204 may actually be comprised of two or more material layers, depending on the device configuration, wherein, in some illustrative embodiments, as previously described with respect to the device 100, silicon dioxide in combination with respective etch stop materials, such as silicon nitride, silicon carbide, nitrogen-enriched silicon carbide and the like, may be used for forming the layer 204. In still other illustrative embodiments, the material layer 204 may even comprise a low-k dielectric material, wherein a low-k material is to be considered as a material having a dielectric constant of 3.0 and significantly less.

Furthermore, an ARC material 205 is formed on the material layer 204, followed by a corresponding resist mask 206, wherein, in this manufacturing stage, a corresponding opening 208 may be formed in the ARC 205 and the material layer 204. The opening 208 may represent any opening as required for providing a contact to the device layer 202, wherein at least the lateral dimensions of the opening 208 may be less than several hundred nanometers and may even be less than 200 nm or less, depending on the critical dimensions of any circuit elements formed in the device layer 202. As previously explained, for forming respective openings 208, such as contact openings, via openings, trenches and the like, with highly scaled lateral dimensions, sophisticated photolithography techniques may be used with appropriate exposure wavelength, such as 248 nm, 193 nm and even less, wherein the respective resist characteristics, such as material composition, layer thickness and the like, may have to be adapted to the respective exposure wavelengths. Hence, the resist mask 206 may be formed with an appropriate thickness of several 100 nm or even less, wherein the thickness of the mask 206 may even be reduced due to a preceding etch process for forming the opening 208. As previously explained, the characteristics of the corresponding ARC material, i.e., the ARC 205, also have to be adapted to provide the desired optical behavior and a reduced degree of nitrogen contamination of the resist material, if a corresponding nitrogen species may be present in some portions of the ARC 205. Thus, in one illustrative embodiment, a substantially nitrogen-free cap layer 205B may be provided as the very last layer of the ARC 205 so as to substantially prevent a contact of the resist material and any nitrogen component, which may be contained in the remaining portions of the ARC 205. It should be appreciated that a "substantially nitrogen-free" material is to be understood in this context as a material without nitrogen in its stoichiometric composition, except for minute contaminations with an amount of approximately 0.5 atomic percent nitrogen with respect to the other atomic species in the layer 205B, at least in the surface area thereof. In one illustrative embodiment, the cap layer 205B may be provided in the form of a silicon dioxide layer, while, in other illustrative embodiments, other appropriate materials may be used, such as carbon-enriched silicon dioxide, silicon carbide and the like.

Since the material composition of the cap layer 205B may substantially be selected with respect to reduced nitrogen contents, the optical characteristics thereof may not be necessarily advantageous with respect to the anti-reflective behavior of the ARC 205 and hence, in some illustrative embodiments, a thickness of the cap layer 205B is selected to be approximately 10 nm and less, and, in some illustrative embodiments, approximately 8 nm and less. Consequently, the influence of the cap layer 205B on the overall optical characteristics may readily be adjusted by providing a respective "bulk" material, for instance in the form of a layer 205A, which may be comprised, in one illustrative embodiment, of silicon oxynitride (SiON) with an appropriately selected ratio of the atomic species in order to adjust the index of refraction and the extinction coefficient on the basis of the corresponding exposure wavelengths as previously explained. In other illustrative embodiments, the layer 205A may be provided in the form of other appropriate materials, such as silicon nitride and the like. In still further illustrative embodiments, the layer 205A may also be provided as a substantially nitrogen-free material composition, for instance in the form of oxygen-enriched silicon carbide, in which case the cap layer 205B may also be comprised of a corresponding material, thereby providing increased flexibility in adjusting the overall optical characteristics and the performance of the ARC 205 in a corresponding resist strip sequence for removing the resist mask 206 and a portion of the ARC material and thereafter in a corresponding sputter etch process.

For example, for an exposure wavelength of 193 nm, the index of refraction may be adjusted to 1.92±0.3, while the extinction coefficient may be approximately 0.65±0.3. When other ARC materials may be used for the layer 205A, the respective material composition may be selected so as to substantially obtain similar values for the index of refraction and the extinction coefficient, thereby providing the required optical response during the photolithography process. In one illustrative embodiment, an intermediate layer of adhesion material 205C may be provided, which, in some illustrative embodiments, may be comprised of silicon dioxide, which exhibits, as previously explained, a very low probability for flaking off of surfaces when being sputtered thereon during a corresponding sputter etch process. The adhesion layer 205C may be followed by a further layer 205D, which, in some illustrative embodiments, may also be comprised of the actual ARC material, such as silicon oxynitride so that, in combination, the layers 205B, 205D, 205C and 205A may provide the corresponding optical response while the intermediate adhesion layer 205C may provide "anti-flaking" material during the subsequent processing of the semiconductor device 200 as will be described later on in more detail. Thus, by stacking the cap layer 205B in combination with the adhesion layer 205C on the basis of an intermediate ARC material provided by the layer 205D, the overall optical response of the ARC 205 may appropriately be adapted, while nevertheless, the required surface characteristics, i.e. nitrogen blocking effect, may be provided by the cap layer 205*b*, which may nevertheless have a desired low thickness, such as approximately 10 nm and significantly less. For example, for the above specified exposure wavelength of 193 nm, a thickness of the layer 205*d* having the effective ARC material may be approximately 10 nm, while the adhesion layer 205*c* may have a thickness of approximately 14 nm for a thickness of approximately 30 nm of the layer 205*a*. It should be appreciated that the corresponding material thicknesses may be appropriately varied so as to take into consideration constraints imposed by the lithography and also by a subsequent etch process in order to obtain the desired performance with respect to a reduced defect rate. That is, in some illustrative embodiments, the position and the thickness of the adhesion layer 205*c* may be determined on the basis of corresponding etch parameters such that a corresponding sputter etch process in a subsequent process stage may be reliably stopped within the adhesion layer 205*c*, thereby providing sufficient adhesion material to etch ambient in order to prevent undue flaking of particles from respective chamber walls of a process tool. For this purpose, the respective amount of material removal of the corresponding process sequence may be determined in advance, for instance by experiment, and the like. Based on the corresponding data, an appropriate target height of the adhesion layer 205*c* within the ARC 205 may be identified for a given thickness thereof. Thus, for a given overall thickness of the ARC 205, the thicknesses of the layers 205*a* and 205*d* may be appropriately adjusted for a thickness of the adhesion layer 205C in order to position the same at the determined target height. In this way, a corresponding release of adhesion material, such as silicon dioxide, into the etch ambient may be obtained with high reliability, thereby providing each substrate 201 with its own source of adhesion material for maintaining the probability for flaking events during the subsequent process sequence at a low and substantially stable level.

The semiconductor device 200 as shown in FIG. 2a may be formed on the basis of the following processes. After providing the substrate 201 having any appropriate configuration, the device layer 202 may be formed on the basis of well-established techniques, which may include sophisticated process sequences for forming advanced circuit elements, such as field effect transistors and the like, and/or which may include process sequences for forming sophisticated metallization structures as previously explained. Thereafter, the material layer 204 may be provided in any appropriate configuration, for instance as an interlayer dielectric material in the form of an etch stop layer and an interlayer dielectric material as previously explained with reference to the device 100, or in any other configuration as required by the design rules. Next, the ARC 205 may be formed on the basis of appropriate deposition techniques, which may enable the provision of adhesion material with a desired concentration and position within the ARC 205 in order to release a sufficient amount in the subsequent sputter etch process. In one illustrative embodiment, silicon oxynitride and silicon dioxide may be used for the layers 205A, 205D and the layer 205C, respectively, wherein also the cap layer 205B may be formed on the basis of silicon dioxide. In this case, the ARC 205 may be formed in a common deposition sequence, thereby ensuring high process throughput without significantly contributing to process complexity compared to the conventional ARC layer 105, as previously explained. Thus, a well established chemical vapor deposition (CVD) deposition tool may be used for forming the ARC 205, wherein the corresponding precursor ratios may be appropriately selected to obtain the stack of layers as shown in FIG. 2a having the required thickness and configuration as described above.

In other illustrative embodiments, a corresponding manufacturing sequence may be used for carbon-enriched silicon dioxide, wherein the amount of carbon may be varied so as to obtain the desired optical characteristics, while silicon dioxide may be provided as the adhesion layer 205C, wherein the cap layer 205B may not necessarily be provided as a silicon dioxide layer, but may have incorporated therein a corresponding amount of carbon with respect to enhanced optical characteristics, since, in this case, the entire ARC 205 may be substantially free of nitrogen. In this case, the adhesion layer 205C may be provided as an intermediate layer, enclosed by the layer 205A comprised of carbon-enriched silicon dioxide and the layer 205D, which may also include the cap layer 205B, both of which may also be comprised of carbon-enriched silicon dioxide. Also in this case, a corresponding target height for the adhesion layer 205C may be determined in advance on the basis of respective experimental or theoretical data for a process sequence to be performed for removing the resist mask 206 and reducing the thickness of the ARC layer 205 prior to a sputter etch process.

Thereafter, the resist mask 206 may be formed on the basis of well-established techniques, followed by a lithography process on the basis of a desired wavelength, such as 193 nm, 248 nm and the like, in order to form a respective opening, based on which the opening 208 may be formed, wherein an appropriately designed etch sequence for etching through the ARC 205 and the material layer 204 may be performed. As previously explained, respective etch steps with appropriately selected etch chemistries may be used in order to pattern the material layer 204 depending on the specific characteristics thereof. For example, in illustrative embodiments, in which the material layer 204 may have substantially the same configuration as the layer 104, similar etch recipes may be used as previously described with reference to the device 100. Next, in one illustrative embodiment, an etch sequence 210 may be performed in which the resist mask may be removed along with a portion of the ARC layer 205. For instance, the etch sequence 210 may be performed in the same process chamber as previously used for forming the opening 208, wherein the corresponding etch chemistry is appropriately adapted to the resist strip process, for instance on the basis of an oxygen plasma ambient, thereby also removing a portion of the ARC layer 205 and providing a highly efficient process flow, as is previously explained. The amount of removed ARC material of the layer 205 may be substantially determined in advance as is previously explained, so that at least a portion of the adhesion layer 205C may be maintained. In some illustrative embodiments, a typical material removal of the ARC 205 may range from several nanometers to approximately 12-15 nm, so that the corresponding etch process 210 may stop within the layer 205D, when the cap layer 205B and the layer 205D may be comprised of silicon dioxide and silicon nitride, respectively. If other material compositions are used for the ARC 205, a corresponding amount of material removal may be determined in advance and may be taken into consideration when positioning the adhesion layer 205C in the ARC 205 as previously explained.

Figure 2B:
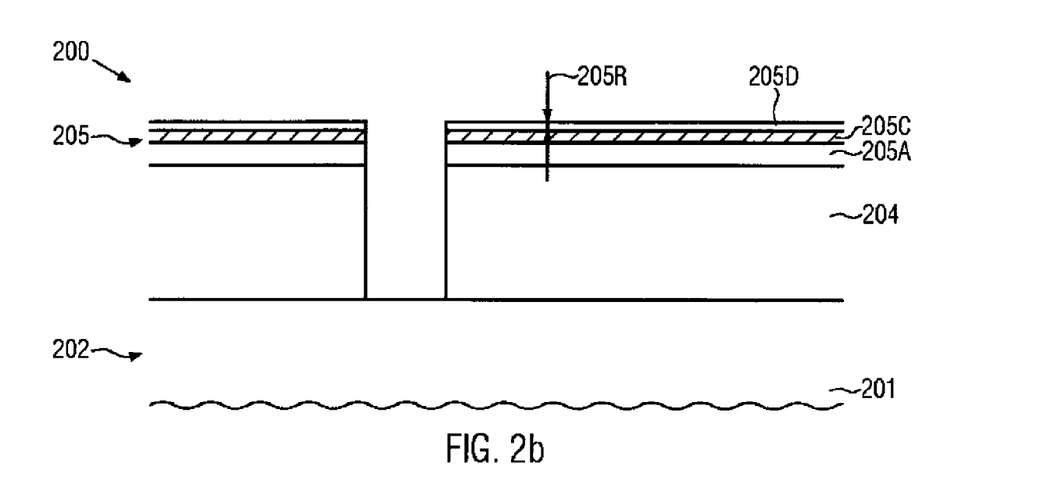

FIG. 2b schematically illustrates the semiconductor device 200 after the end of the etch process 210 according to some illustrative embodiments, in which at least a portion of the layer 205D may still be present, wherein it should be appreciated that a remaining thickness 205R of the residual layer 205D may be less compared to the thickness of the layer 205D consumed during a subsequent sputter etch process. As previously explained, the position of the adhesion layer 205C has been selected such that the layer 205C may be exposed and be partially consumed by the subsequent sputter etch process in order to release sufficient "anti-flaking" material during the sputter etch process.

Figure 2C:
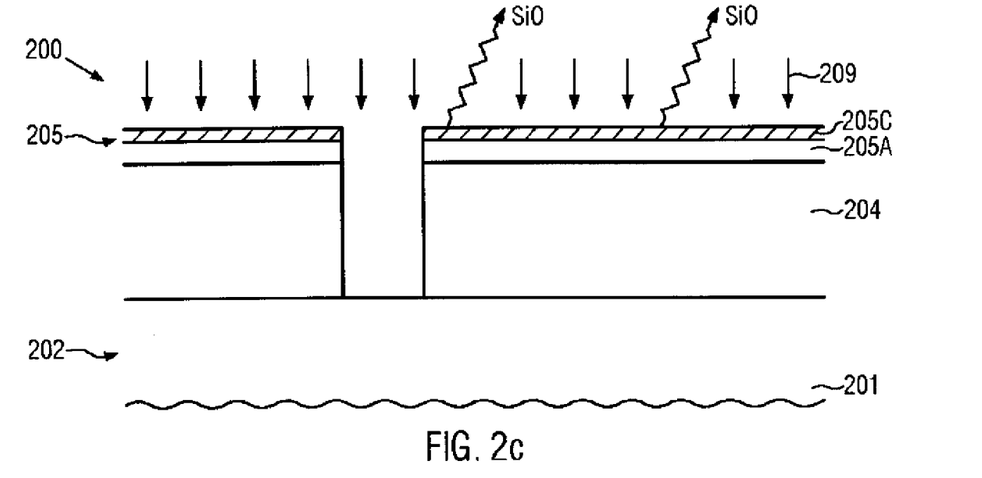

FIG. 2c schematically illustrates the semiconductor device 200 in a further advanced manufacturing stage, when the device 200 is subjected to a sputter etch process 209 for pre-cleaning respective exposed surface portions of the opening 208 and especially of a bottom face thereof. In one illustrative embodiment, the sputter etch process 209 may be performed as an initial phase of a sputter deposition process for forming a conductive barrier material within the opening 208. As previously explained, the process 209 may result in a material consumption of the remaining ARC 205 which may be released into the etch atmosphere and may partially deposit on respective surfaces of a process chamber, such as chamber walls and the like. It has been recognized that, in particular, silicon nitride material may exhibit a high probability for accumulating at respective foreign surfaces with reduced adhesion, thereby resulting in an increased probability for flaking off during the further processing. Contrary to the conventional process flow as previously described, the sputter etch process 209 may, however, result in an exposure of the adhesion layer 205C, the material of which is known to exhibit a high adhesion when deposited on foreign surfaces, thereby also "passivating" other material compositions, which may also be sputtered onto the respective surfaces. Consequently, even though a certain amount of the material layer 205D may be consumed during the sputter process 209, the release of silicon dioxide from the layer 205C may provide an efficient stabilization of the process conditions during the process 209 and a subsequent deposition of a conductive barrier material. For this purpose, the position and the thickness of the layer 205C have been selected such that a significant amount thereof may be consumed during the sputter etch process 209, wherein, in one illustrative embodiment, the thickness and height position of the layer 205C may be selected such that the sputter etch process 209 actually stops within the layer 205C. Appropriate parameter values of the thickness and height position may be obtained on the basis of the respective removal rates of the processes 210 and 209, as is previously described. Consequently, each substrate 201 contains its own source of adhesion material, thereby also providing substantially constant process conditions during a continuous processing of the plurality of substrates 201.

Figure 2D:
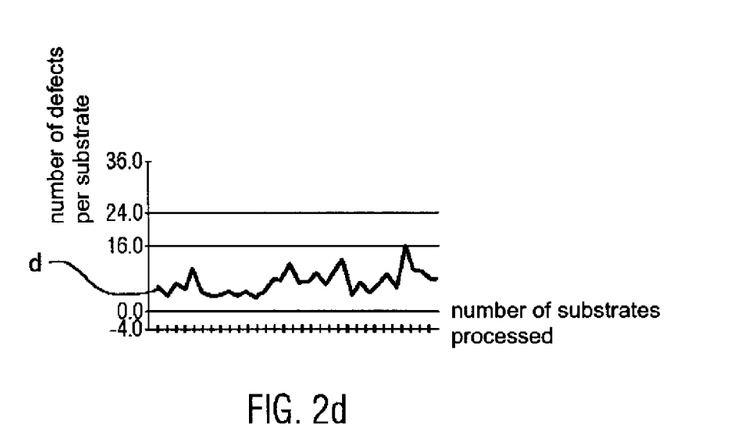
FIG. 2d schematically illustrates the time progression of a defect rate in a sputter etch tool processing an ARC layer according to illustrative embodiments disclosed herein.

FIG. 2d schematically illustrates a graph representing the time progression of a defect rate obtained from a plurality of substrates having formed thereon the ARC 205 as explained above. As is evident from FIG. 2d, the corresponding defect rate of the sputter etch process 209 may substantially remain below a specified process margin "d," which may indicate a maximum tolerable defect rate, wherein a significantly enhanced long term stability with respect to the defect rate may also be observed. Consequently, high throughput in combination with improved production yield may be obtained by providing the enhanced ARC 205 having incorporated therein an appropriated positioned source of adhesion material for reducing the flaking tendency during the sputter etch process 209.

Figure 2E:
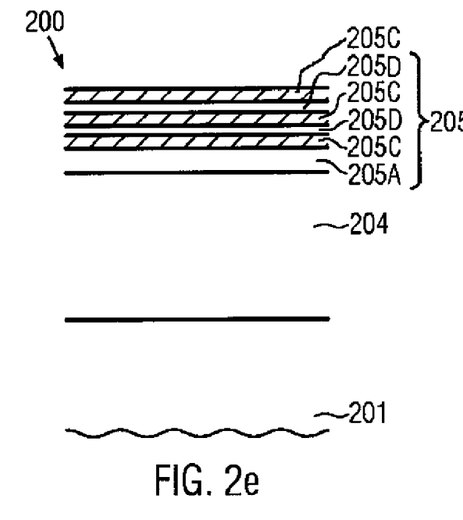
FIGS. 2e-2g schematically illustrate cross-sectional views of semiconductor devices comprising ARC layers with reduced probability for flaking according to yet other illustrative embodiments disclosed herein.

FIG. 2e schematically illustrates the semiconductor device 200 according to further illustrative embodiments. Here, the ARC 205 may be provided with a base layer 205A, which may comprise the main portion of the actual ARC material, such as silicon oxynitride and the like, while a plurality of alternating layers 205C, 205D are formed above the layer 205A, which comprise an adhesion material and an "ARC" material, respectively. For instance, silicon dioxide may be used for the layers 205C so that the uppermost layer 205C may act as an efficient capping layer for suppressing a nitrogen contamination of a resist layer to be formed on the ARC 205. In other cases, when the layers 205D are comprised of an ARC material substantially without nitrogen, the uppermost layer may also be provided in the form of an ARC material of the layer 205D. Furthermore, in some illustrative embodiments, the layers 205C and 205D may be provided with an appropriate thickness, approximately 8 nm or even less, wherein the actual positioning of each of the layers 205C and 205D is less critical, since a certain amount of adhesion material of the layers 205C may be released in any case during the sputter etch process 209 irrespective of a parameter variation during the etch processes 210 and 209. That is, during the previously described etch process 210 and the sputter etch 209, a significant amount of adhesion material will be released, irrespective of whether the process 209 may actually stop in one of the layers 205C or 205D, thereby also providing increased long-term stability of the corresponding process sequence. By providing a plurality of alternating layers 205C, 205D, any process fluctuations during the processes 210 and 209 may not substantially adversely affect the "anti-flaking" characteristics of the ARC 205, since the adhesion material is distributed more evenly across an upper portion of the ARC 205. Advantageously, the overall thickness of the alternating layers 205C, 205D may be selected so as to take into consideration a maximum acceptable removal rate in the processes 210 and 209, in order to avoid a situation in which a significant amount of the base layer 205A may be removed in the final sputter etch process 209 without any adhesion material being available.

Figure 2F:
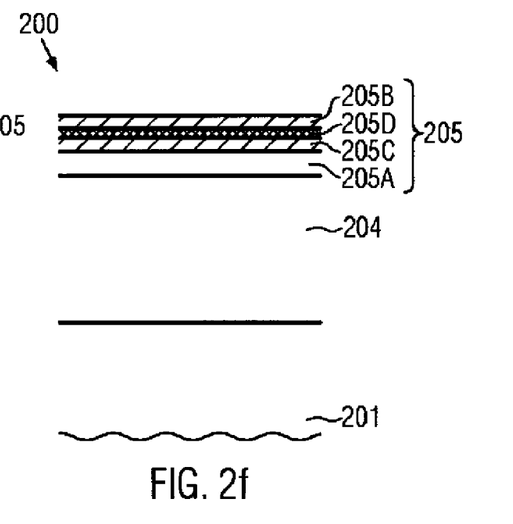

FIG. 2f schematically illustrates the semiconductor device 200 according to a further illustrative embodiment, in which the ARC 205 may comprise a base layer 205A, for instance comprised of silicon oxynitride, carbon-enriched silicon dioxide and the like. Furthermore, the adhesion layer 205C is formed at an appropriate target height position within the ARC 205 as is previously explained, followed by the layer 205D which may comprise an efficient ARC material, which may exhibit a different material composition compared to the base layer 205A. For example, the layer 205D may be formed of silicon nitride, silicon oxynitride having a different material composition compared to the layer 205A, carbon-enriched silicon dioxide and the like. The layer 205B may then be comprised of a substantially nitrogen-free material, or the layer 205D, when formed from a substantially nitrogen-free material, may also act as a cap layer, while, in other embodiments, the cap layer 205B may be provided in the form of any appropriate material, such as silicon dioxide, carbon-enriched silicon dioxide and the like. Also, in this case, the "anti-flaking" material of the adhesion layer 205C may provide enhanced long-term stability of the corresponding sputter etch process 209 irrespective of the material composition of the layers 205D and 205B, wherein, for example, the layer 205D may provide enhanced flexibility in designing the optical characteristics without having to take into consideration the corresponding flaking behavior during the sputter etch process 209. It should be appreciated that the corresponding target height position of the adhesion layer 205C may have to be adjusted with respect to the corresponding thicknesses and etch behaviors of the layers 205D and 205B, which may readily be established on respective experimental data.

Figure 2G:
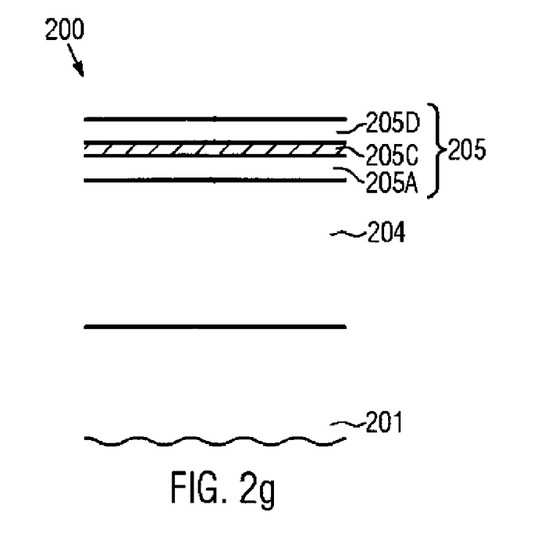

FIG. 2g schematically illustrates the semiconductor device 200 in accordance with yet other illustrative embodiments in which the ARC 205 may be substantially comprised of a substantially nitrogen-free material, such as carbon-enriched silicon dioxide, provided in the form of the layers 205A and 205D, wherein the adhesion layer 205C is located at an intermediate position so as to be exposed during the sputter etch process 209 as is previously explained. In this case, a single adhesion layer 205C and a simple configuration of the ARC 205 may be provided, while nevertheless an increased long-term stability with respect to the defect rate may be obtained. It should be appreciated that, in the embodiments described above, the various transitions between the individual layers, such as the transition between layers 205A to a corresponding adhesion layer 205C and from the layer 205C to other layers 205D, may not necessarily be provided as moderately sharp transitions, but may include gradual transitions. For instance, in a silicon nitride layer, the contents of nitrogen may gradually increase to finally obtain a silicon dioxide layer acting as the adhesion layer 205C, while, in other illustrative embodiments, the carbon contents may be varied so as obtain a substantially pure silicon dioxide material at the specified target height.

Furthermore, it is to be noted that any statements regarding the position of a layer is to be understood as a relative position information, wherein the respective substrate, such as the substrates 101, 201 serve as reference. Thus, a first layer is located above a second layer, when a distance of the second layer to the substrate is less compared to the distance of the first layer to the substrate. Similarly, a height position of a layer in a layer stack is to be understood as the distance of the layer under consideration to the bottom surface of the lowest layer of the layer stack, wherein "low" is to be understood in the above-defined sense.

As a result, the subject matter disclosed herein provides a technique for forming an ARC layer having incorporated therein a source of "anti-flaking" material that is provided at a position within the ARC stack so as to be released during a sputter etch process for reducing the flaking probability of materials deposited on respective chamber walls and the like. Consequently, a highly efficient overall process flow may be maintained, in which a portion of the ARC layer stack may be removed in a process sequence for patterning a corresponding material layer and also removing the corresponding resist mask, which may result in a conventional strategy in an increased defect rate that may even increase with time, thereby typically requiring countermeasures that may reduce process efficiency and/or tool throughput. Thus, by providing the internal source of the adhesion material which may be reliably released during the sputter etch process, high production yield in combination with high throughput may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an anti-reflective layer stack with preselected optical characteristics on a material layer located above a substrate, said anti-reflective layer stack comprising a substantially nitrogen-free cap layer and at least one intermediate adhesion layer, said adhesion layer having a higher adhesion on a surface when sputtered off during a sputter cleaning process compared to a further material contained in said anti-reflective layer stack;
    patterning said anti-reflective layer stack and said material layer on the basis of a resist mask formed above said anti-reflective layer stack to form an opening in said material layer;
    removing said resist mask and at least said cap layer in a common etch sequence; and
    performing said sputter cleaning process prior to depositing a barrier material in said opening, said sputter cleaning process consuming a portion of said intermediate adhesion layer.

2. The method of claim 1, wherein said substantially nitrogen-free cap layer is comprised of silicon dioxide.

3. The method of claim 1, wherein forming said anti-reflective layer stack comprises forming at least one intermediate layer between said cap layer and said intermediate adhesion layer, said at least one intermediate layer having a different material composition compared to said cap layer and said intermediate adhesion layer.

4. The method of claim 3, wherein said at least one intermediate layer is comprised of a compound containing silicon, oxygen and nitrogen.

5. The method of claim 1, wherein a thickness of said cap layer is approximately 10 nm or less.

6. The method of claim 1, further comprising determining an expected material removal during said patterning process and said sputter cleaning process and selecting a thickness and a position of said intermediate adhesion layer on the basis of said expected material removal.

7. The method of claim 1, further comprising forming a plurality of alternating intermediate layers, one of each pair of adjacent intermediate layers comprising material as used in said intermediate adhesion layer.

8. The method of claim 1, wherein a thickness of said anti-reflective layer stack is approximately 65 nm or less.

9. The method of claim 1, wherein said intermediate adhesion layer is comprised of silicon dioxide.

10. The method of claim 1, wherein a thickness of said intermediate adhesion layer is greater than a thickness of said cap layer.

11. A method, comprising:
    determining a removal rate for material of an anti-reflective layer stack during an etch process sequence including a resist strip process and a sputter etch process, said anti-reflective layer stack comprising one or more material layers having a first material composition, a cap layer of a first specified thickness and an adhesion layer having a second material composition other than said first material composition, a material of said adhesion layer having an increased adhesion to foreign surfaces when sputtered off during said sputter etch process compared to said first material composition;
    determining a target height position of said adhesion layer within said anti-reflective layer stack, said target height position specifying a position where at least a portion of said adhesion layer is consumed after said sputter etch process; and
    forming said anti-reflective layer stack with said adhesion layer positioned at said target height above a plurality of substrates having formed thereon a dielectric layer to be patterned on the basis of said anti-reflective layer stack.

12. The method of claim 11, wherein said adhesion layer has a second thickness, wherein a sum of said first and second thicknesses is less than a combined thickness of said one or more material layers of said anti-reflective layer stack.

13. The method of claim 11, wherein said cap layer is a substantially nitrogen-free material layer.

14. The method of claim 13, wherein said cap layer is comprised of silicon dioxide.

15. The method of claim 11, wherein said adhesion material layer comprises silicon dioxide.

16. The method of claim 11, wherein said first thickness is 10 nm or less.

17. A method, comprising:
    forming an anti-reflective layer stack on a material layer of a microstructure device, said anti-reflective layer stack comprising at least a first material and a second material other than said first material;
    removing a first portion of said anti-reflective layer stack during a resist strip process; and
    removing a second portion of said anti-reflective layer stack by a sputter process, said second portion comprising said first and second materials.

18. The method of claim 17, wherein forming said anti-reflective layer stack comprises forming a substantially nitrogen-free cap layer as a last layer of said anti-reflective layer stack.

19. The method of claim 17, wherein said first and second materials are provided as alternating layers in an upper stack portion.

20. The method of claim 17, wherein one of said first and second materials comprises silicon dioxide.

* * * * *